(12) United States Patent
Kuiper et al.

(10) Patent No.: US 6,414,744 B1
(45) Date of Patent: Jul. 2, 2002

(54) MASK HANDLING APPARATUS FOR LITHOGRAPHIC PROJECTION APPARATUS

(75) Inventors: Doede Kuiper, Vught; Jan J. Kuit, Boxtel, both of (NL)

(73) Assignee: Asml Netherlands B.V., Veldhoven (NL)

( * ) Notice: Subject to any disclaimer, the term of this patent is extended or adjusted under 35 U.S.C. 154(b) by 0 days.

(21) Appl. No.: 09/551,916

(22) Filed: Apr. 19, 2000

(30) Foreign Application Priority Data

Apr. 21, 1999 (EP) .............................................. 99201225

(51) Int. Cl.$^7$ .......................... G03B 27/62; B65G 49/07
(52) U.S. Cl. ........................... 355/75; 355/76; 414/935; 414/941
(58) Field of Search .............................. 355/43, 53, 72, 355/75, 76, 77; 235/381; 414/331.18, 935–941

(56) References Cited

U.S. PATENT DOCUMENTS

| | | | |
|---|---|---|---|
| 4,676,637 A | * 6/1987 | Uto et al. ................. | 356/237.4 |
| 4,769,680 A | * 9/1988 | Resor, III et al. ............. | 355/43 |
| 4,984,953 A | * 1/1991 | Nakazato et al. ...... | 414/331.18 |
| 4,999,671 A | * 3/1991 | Iizuka ........................ | 355/97 |
| 5,442,163 A | * 8/1995 | Nakahara et al. ............ | 235/381 |
| 5,559,584 A | * 9/1996 | Miyagi et al. ................. | 355/73 |
| 5,909,030 A | * 6/1999 | Yoshitake et al. ....... | 250/492.2 |
| 5,980,187 A | * 11/1999 | Verhovsky ............. | 414/416.03 |

* cited by examiner

Primary Examiner—Russell Adams
Assistant Examiner—Rodney Fuller
(74) Attorney, Agent, or Firm—Pillsbury Winthrop LLP

(57) ABSTRACT

A lithographic projection apparatus comprises an illumination system for supplying a projection beam of radiation, a mask table provided with a mask holder for holding a mask, a substrate table provided with a substrate holder for holding a substrate, and a projection system for imaging an irradiated portion of the mask onto a target portion of the substrate. The lithographic projection apparatus further comprises a mask-handling apparatus to exchange a mask between a load-port module for receiving masks and the mask holder, the mask-handling apparatus having first and second robots for carrying out the exchange. The first robot exchanges a mask between the load-port module and the second robot, and the second robot exchanges a mask between the first robot and the mask holder. Further, the first robot may also transfer a mask to an internal mask library and a mask inspection module. Pre-alignment units may be present to detect the position of a mask in exchanging a mask between the first robot and the second robot, and between the second robot and the mask holder.

14 Claims, 5 Drawing Sheets

MASK HANDLING APPARATUS FOR LITHOGRAPHIC PROJECTION APPARATUS

FIELD OF THE INVENTION

The invention relates to a mask-handling apparatus used in lithographic projection apparatus for imaging of a mask pattern in a mask onto a substrate.

More particularly it relates to a mask-handling apparatus having a load-port module constructed to receive masks, the mask-handling apparatus being constructed and arranged to exchange a mask between the load-port module and the mask holder.

BACKGROUND OF THE INVENTION

A lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die at once; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. More information with regard to lithographic devices as here described can be gleaned from International Patent Application WO 97/33205.

Lithographic apparatus may employ various types of projection radiation, such as ultraviolet (UV) radiation, extreme UV (EUV) radiation, X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc; for simplicity, such components may be loosely referred to in this text, either singly or collectively, as a "lens".

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine. The apparatus may also have more than one mask table and may comprise components which are operated in vacuum, and are correspondingly vacuum-compatible.

A mask present on the mask table will be exchanged for another one when another mask pattern is required for imaging. The latter mask has to be discharged from the mask table and another mask has to be taken from some location and loaded on the mask table. The exchange process may take some time, which will result in a decreased throughput of the lithographic projection apparatus.

An object of the present invention is to provide a mask handler in a lithographic projection apparatus that enables a very short reticle exchange process to yield an improved throughput of substrates and therefore an improved cost of ownership of the apparatus.

SUMMARY OF THE INVENTION

According to the present invention there is provided a lithographic projection apparatus for imaging of a mask pattern in a mask onto a substrate, said apparatus comprising:

an illumination system constructed and arranged to supply a projection beam of radiation;

a mask table provided with a mask holder constructed to hold a mask;

a substrate table provided with a substrate holder constructed to hold a substrate;

a projection system constructed and arranged to image an irradiated portion of the mask onto a target portion of the substrate; and a mask-handling apparatus comprising a load-port module constructed to receive masks, the mask-handling apparatus being constructed and arranged to exchange a mask between the load-port module and the mask holder, characterized in that the mask-handling apparatus further comprises a first robot and a second robot, the first robot being constructed and arranged to exchange a mask between the load-port module and the second robot, and the second robot being constructed and arranged to exchange a mask between the first robot and the mask holder.

The first and second robots allow for a concurrent exchange of a mask at the load-port module and of a mask at the mask table, and the configuration may be designed such that the first robot presents a new mask to the second robot at the moment a mask should be interchanged on the mask table for another one. Both robots may be designed for their specific tasks in a mask-handling sequence, the second robot being constructed such that the actual transfer to the mask holder of the mask table takes place very fast and efficiently.

An embodiment of such a second robot is provided with two mask holding arrangements, which allows placement of a new mask in one of the mask holding arrangements before or during unloading of a mask from the mask table in another one of the mask holding arrangements. Removal of the unloaded mask and supply of the new mask may then take place in one quick action. Preferably, the second robot is rotatable, for instance like a carousel, for a very quick and efficient transfer of the new mask to the mask table by a simple rotation.

In a further embodiment each mask holding arrangement of the second robot comprises an elevator constructed to exchange a mask between the second robot and the mask holder, and the elevators may be provided with vacuum-operated end-effectors constructed to hold a mask at its top side.

The load-port module, the robots and the mask holder may be understood as mask stations that are constructed to receive a mask. In yet a further embodiment, the mask-handling apparatus comprises one or more further mask stations constructed to receive a mask, the first robot being constructed and arranged to exchange a mask between one of the load-port module, the second robot and the further mask station or stations and another one of the load-port module, the second robot and the further mask station or stations. The further mask station or stations may comprise a mask library constructed and arranged to store one or more masks, and/or a mask inspection station constructed and arranged to check a mask for contamination. Such further mask stations improve the functionality of the mask handler, and the two-robot configuration allows the first robot to be constructed such as to be able to exchange a mask between the various stations while the actual exchange of masks at the mask table may still take place very fast.

A conveniently constructed first robot has an arm-like configuration provided with three rotary joints such as to allow movement in a plane. Such a configuration allows mask to be exchanged readily between various mask stations positioned such that they may be accessed in the plane of movement of the first robot. It allows translation of the mask in at least such a plane in which the mask stations may be provided, and it also allows the mask to be rotated about an axis that is perpendicular to said plane for efficiently orienting and translating a mask towards a mask station. The first robot may further comprise a linear actuator such as to allow for a translation in a direction perpendicular to said plane to be able to access mask stations that are offset at various height levels or various height levels within one mask station, for instance the mask library.

To allow the first and second robots to be aligned with respect to each other during exchange, and to allow the second robot and the mask holder to be aligned with respect to each other, the mask-handling apparatus preferably further comprises at least one pre-alignment unit constructed and arranged to detect a position of a mask held by one of the first robot, the second robot and the mask holder, the or each pre-alignment unit being associated with a position of the second robot allowing for exchange of a mask with one of the first robot and the mask holder.

According to yet a further aspect of the invention there is provided a method of manufacturing a device using a lithographic projection apparatus comprising:

an illumination system constructed and arranged to supply a projection beam of radiation;

a mask table provided with a mask holder constructed to hold a mask;

a substrate table provided with a substrate holder constructed to hold a substrate;

a projection system constructed and arranged to image an irradiated portion of the mask onto a target portion of the substrate; and a mask-handling apparatus comprising a load-port module constructed to receive masks, the mask-handling apparatus being constructed and arranged to exchange a mask between the load-port module and the mask holder, said method comprising the steps of:

providing a mask bearing a pattern to the mask holder;

providing a substrate which is at least partially covered by a layer of radiation-sensitive material to the substrate table; and using the projection beam of irradiation to project an image of at least a portion of the mask pattern onto a target portion on the substrate, characterized in that said step of providing a mask bearing a pattern to the mask holder comprises the sub-steps of:

providing the mask to the load-port module;

using a first robot provided in the mask-handling apparatus to exchange the mask between the load-port module and a second robot provided in the mask-handling apparatus; and using the second robot to exchange the mask between the first robot and the mask holder.

In a manufacturing process using a lithographic projection, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its attendant advantages will be further elucidated with the aid of exemplary Embodiments and the accompanying schematic drawings, in which like reference numerals indicate identical or like parts, and in which:

FIG. 4b depicts in a front view an end-effector of the second robot of FIG. 4a;

DETAILED DESCRIPTION OF THE EMBODIMENTS

Figure 1:
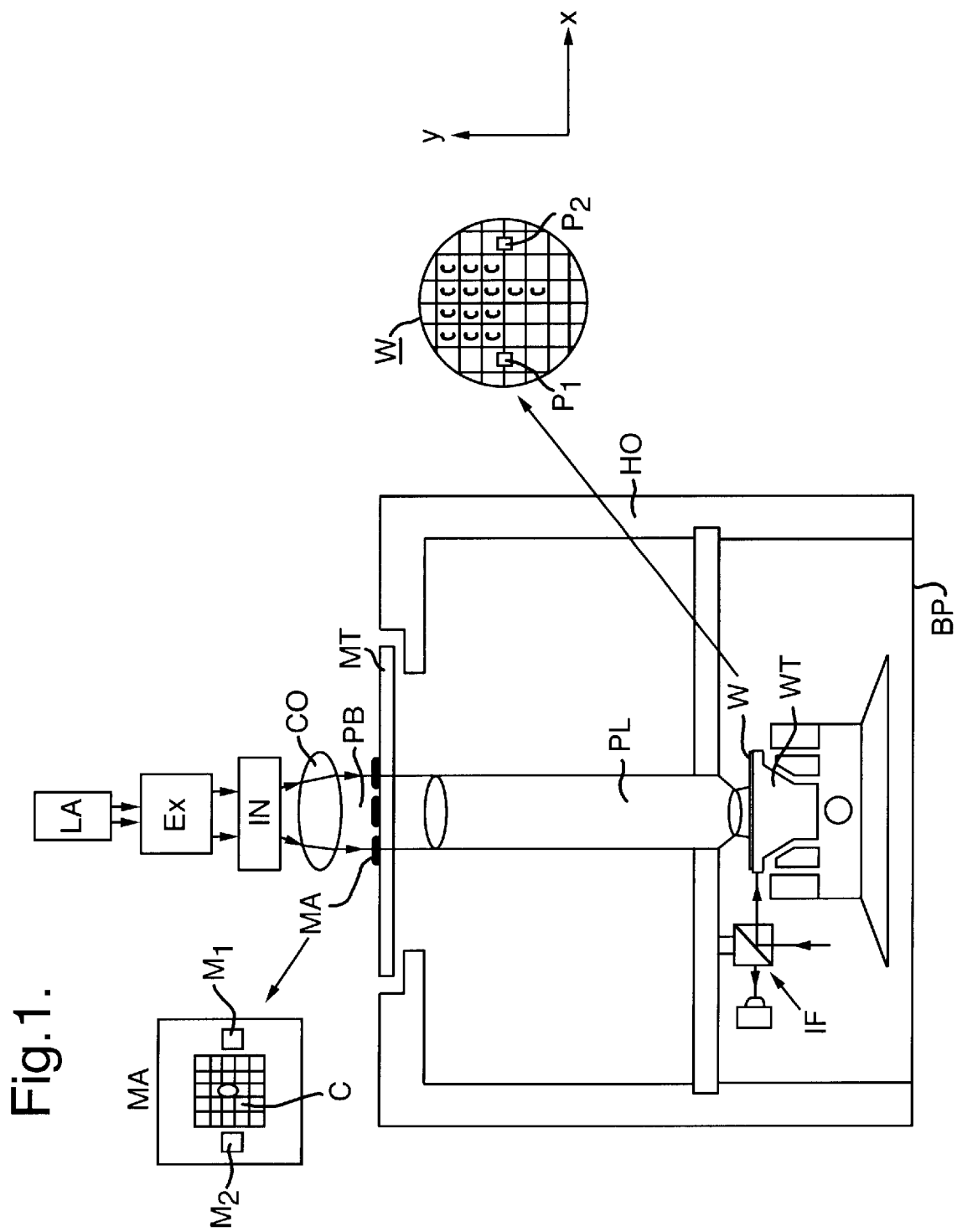
FIG. 1 schematically depicts a lithographic projection apparatus according to the invention.

FIG. 1 schematically depicts a lithographic projection apparatus according to the invention. The apparatus comprises:

- an illumination system LA, Ex, IN, CO for supplying a projection beam PB of radiation (e.g. ultraviolet light with a wavelength of 365 nm, 248 nm, 193 nm or 157 nm);
- a mask table MT provided with a mask holder for holding a mask MA (e.g. a reticle);
- a substrate table WT provided with a substrate holder for holding a substrate W (e.g. a resist-coated silicon wafer); and
- a projection system PL (e.g. a lens or catadioptric system, or a mirror group) for imaging an irradiated portion of the mask MA onto a target portion C (die) of the substrate W.

In this case, the depicted apparatus comprises refractive components. However, it may alternatively comprise one or more reflective components.

The illumination system comprises a radiation source LA which produces a beam of radiation. This beam is passed along various optical components,—e.g. beam shaping optics Ex, an integrator IN and a condensor CO—so that the resultant beam PB is substantially collimated and uniformly intense throughout its cross-section.

The beam PB subsequently intercepts the mask MA which is held in a mask holder on a mask table MT. Having passed through the mask MA, the beam PB passes through the projection system PL, which focuses the beam PB onto a target area C of the substrate W. With the aid of the interferometric displacement and measuring means IF, the substrate table WT can be moved accurately, e.g. so as to position different target areas C in the path of the beam PB.

The depicted apparatus is most commonly used in one of the two different modes:

1. In step mode, the mask table MT is fixed, and an entire mask image is projected at once (i.e. a single "flash") onto a target area C. The substrate table WT is then shifted in the x and/or y directions so that a different target area C can be irradiated by the (stationary) beam PB; and
2. In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target area C can be exposed, without having to compromise on resolution.

Figure 2:
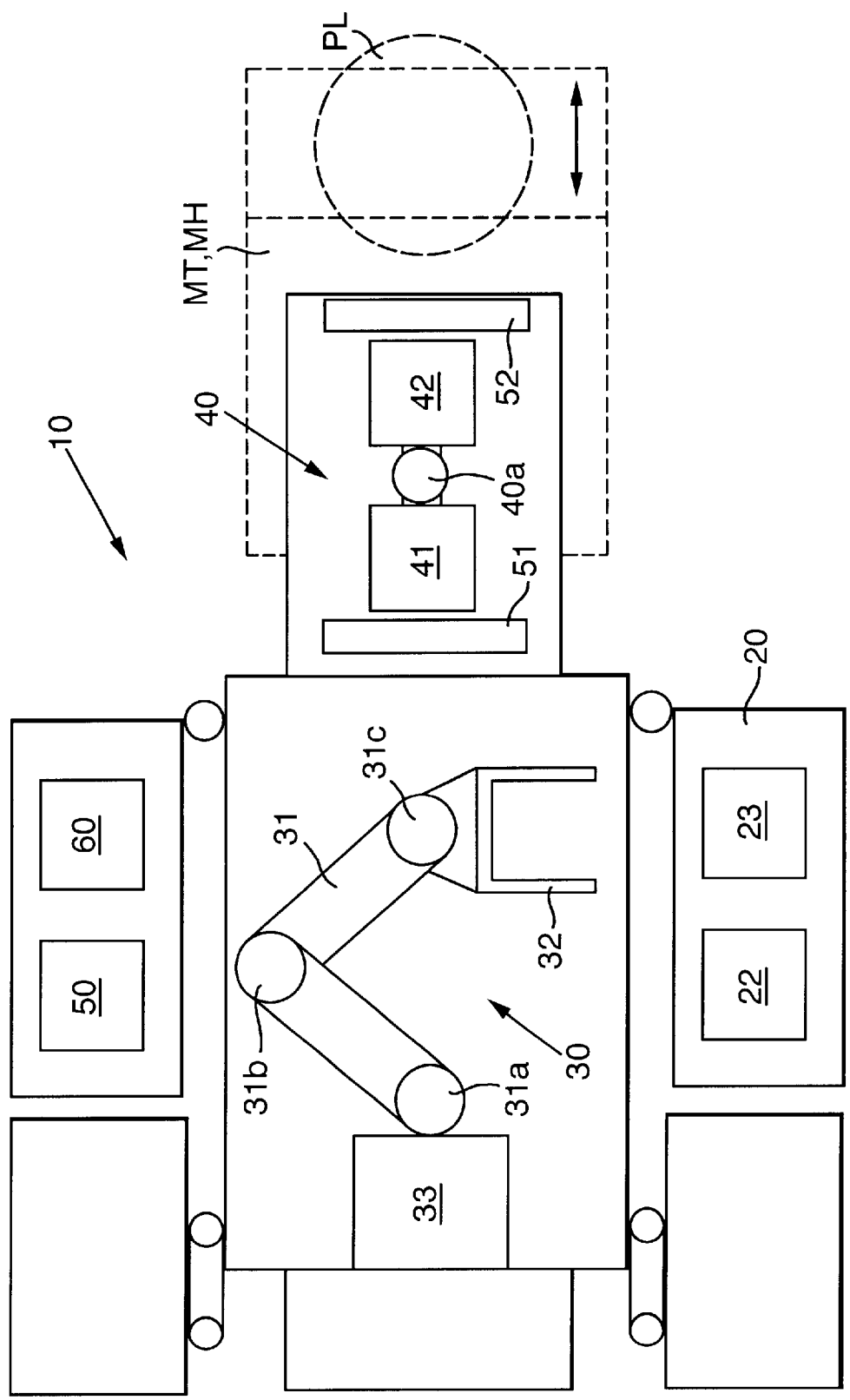
FIG. 2 schematically depicts in a plan view a mask-handling apparatus of the lithographic projection apparatus of FIG. 1.

FIG. 2 shows in more detail mask-handling apparatus or mask handler 10 and its position with respect to the projection system PL and mask table MT comprising mask holder MH. Mask handler 10 comprises a load-port module 20, a first robot 30 having an arm 31 and an end-effector 32 for holding a mask, and a second robot 40 having first and second mask holding arrangements 41, 42. FIG. 2 further shows internal mask library 50 and mask inspection module 60 being part of mask handler 10. Mask library 50 and mask inspection module 60 are optional and add further functionality to mask handler 10 to allow for further internal storage of masks and for inspection of masks for contamination, respectively. They may also be omitted from the handler.

Masks may be supplied to mask handler 10 using standard bottom-opening carrier boxes containing one or more masks (reticles) in an actual mask carrier arrangement within the closed carrier box. Two load-ports 22, 23 are shown to be present on the load-port module 20 for receiving a carrier box containing the mask(s). Load-ports 22, 23 are provided with an elevator to lower the actual carrier arrangement from the box, and are further provided with a barcode reader to quickly identify a mask when extracted from its carrier arrangement, sensors to provide machine safety and sensors to check pellicle frame dimensions. More than two load-ports may be provided to provide for additional storage of masks. A single load-port may also be provided. When the load-port module 20 has received a carrier box containing one or more masks, a mask may be taken from a lowered mask carrier arrangement of the carrier box using the first robot 30. Subsequently, the mask may be transferred by first robot 30 to internal mask library 50, mask inspection module 60 or second robot 40.

Internal mask library 50 provides for additional storage capacity for masks, first robot 30 having a fast access to a mask stored in the library. It further provides for mask temperature conditioning to have a mask acquire the same temperature as the mask holder and table. The respective temperatures should be identical to prevent strain and deformation of the mask when held on the mask holder, which may influence the accuracy of the imaging process of the lithographic apparatus. Mask library 50 is continuously purged with a clean gas, such as air, for temperature conditioning and for cleanliness of the masks. It further has a protective covering that will be closed when the lithographic apparatus is not operating, and is provided with its own barcode reader in order to yield fast inventory during start-up and/or recovery from data loss.

In the mask inspection module 60, a mask may be checked for contamination, for instance, before it is being transferred to mask table MT. It contains a dedicated robot to move the mask within the inspection module with respect to a light source, such as a laser, that is focussed onto the mask. A suitable detector detects light scattered by any contamination present. The inspection module robot further allows for moving the inspected mask into the focus plane of the light source. A passive mask table is provided in the inspection module to exchange a mask between the robot of inspection module 60 and first robot 30. Hard-wired electronic sensors and respective signals provide safety during exchange.

Figure 3:
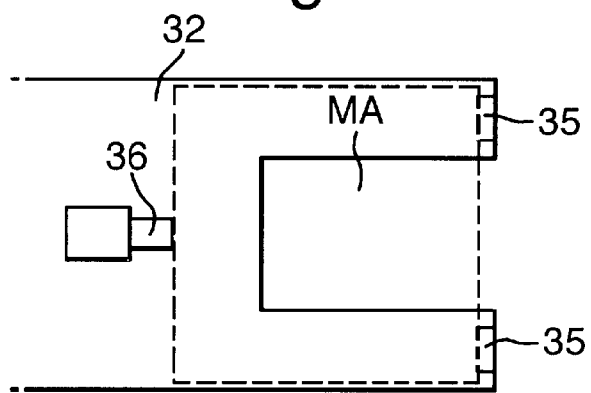
FIG. 3 depicts the end-effector of the first robot of the mask-handling apparatus of FIG. 2 in more detail.

First, or mask-handling, robot 30 is a clean-room compatible robot having an arm-like configuration. FIG. 2 shows that robot arm 31 comprises a shoulder joint 31a, an elbow joint 31b and a wrist joint 31c to allow for movement in the plane of the drawing. Arm 31 is mounted on a linear Z-actuator for movement in a direction perpendicular to the plane of the drawing. End-effector 32 is arranged on wrist joint 31c that provides for 360° rotation, and has a fork-like configuration on which a mask may be positioned. A mask MA is held on the fork-like arrangement, further shown in FIG. 3 in a top view, by abutting against bosses 35 at a side of the fork opposing wrist joint 31*c* and by mechanical action of a pneumatic plunger 36 that is arranged at a side adjacent wrist joint 3 1*c* such that mask MA is held in between bosses and plunger. Mask MA is shown in phantom in FIG. 3. Plunger 36 also detects the presence of a mask. A safety bar (not shown) is arranged around end-effector 32 to protect the mask and end-effector from excessive forces during calibrations or collisions. Mask-handling robot 30 further comprises a torque/force sensor for automatic calibration of relative positions of any mask destination and for apparatus and mask safety to stop first robot 30 if forces and/or torques are in excess of a preset value. For additional safety, end-effector 32 is provided with a breakout mechanism that physically limits the forces and/or torques exerted by the end-effector on the mask or its environment and that will shut robot 30 down in that case.

Figure 4A:
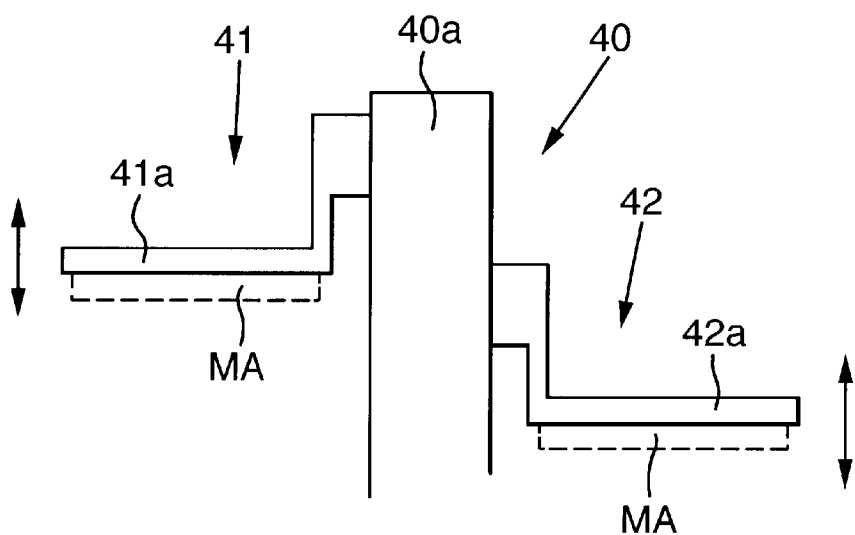
FIG. 4a depicts in a side view the second robot of the mask-handling apparatus of FIG. 2.
Figure 4B:
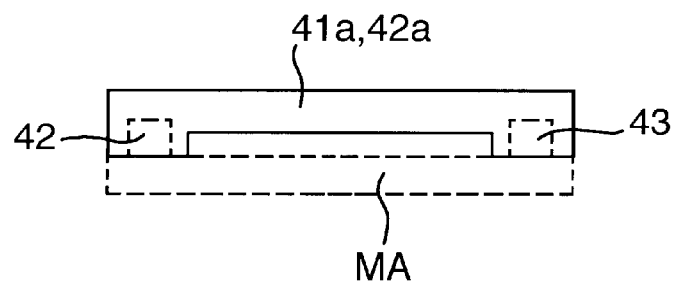

Second, or mask-exchange, robot 40 comprises two mask-holding arrangements 41, 42 that take the form of elevators having vacuum-operated end-effectors 41*a*, 42*a* for effectively holding a mask MA at its top side by a vacuum. Second robot 40 is further shown in FIG. 4*a* in a side view, mask MA being shown in phantom. Such mask-holding arrangements 41, 42 allow for an efficient transfer of a mask by lowering it onto mask holder MH of mask table MT. Aluminum vacuum-operated end-effectors 41*a*, 42*a* with a hard anodized coating have shown to provide a good cleanliness performance. FIG. 4*b* depicts in a front view end-effectors 41*a*, 42*a* having vacuum chamber sets 42, 43 for holding mask MA by a vacuum. Further, second robot 40 is configured as a rotating carousel having both mask-holding arrangements 41, 42 positioned symmetrically at opposite sides of rotation axis 40*a*.

Figure 5:
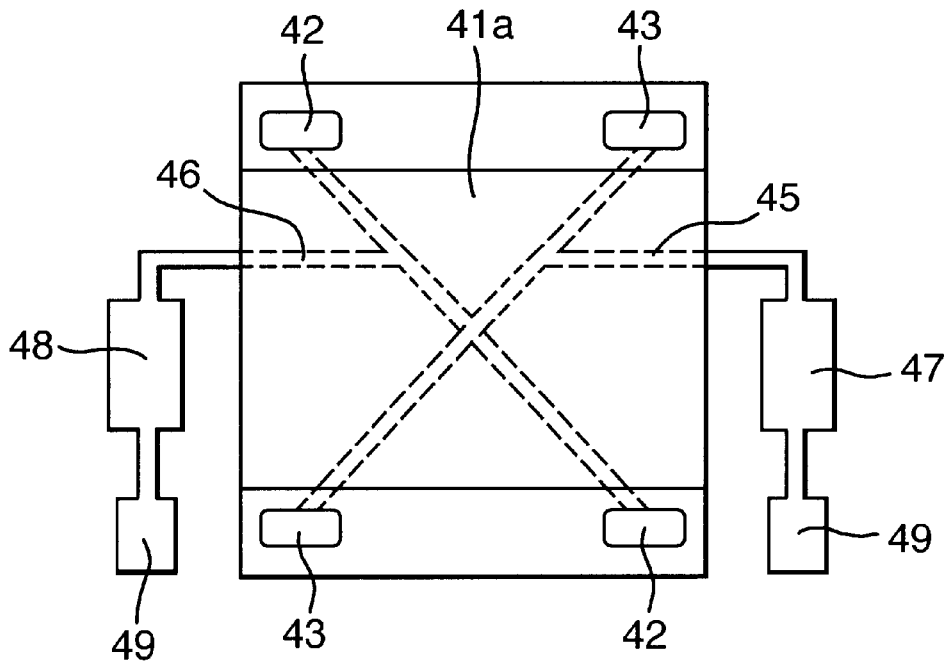
FIG. 5 schematically depicts in a bottom view the end-effector of FIGS. 4a and 4b.

To provide robustness against a loss of vacuum, robot 40 is provided with two independent vacuum chamber sets 42, 43 per end-effector 41*a*, 42*a* with independent routing of vacuum tubes 45, 46 connected to vacuum pump(s) 49, each set being sufficient to carry the weight of a mask. FIG. 5 schematically depicts a bottom view of end-effector 41*a*, end-effector 42*a* being identical. Further, passive vacuum tanks 47, 48 arranged in robot 40 will buffer vacuum fluctuations and provide capacity for retaining a mask during a short time interval, e.g. 30 seconds, after a loss of vacuum. Built-in emergency vacuum pumps will be started after a loss of machine vacuum and are powered from an uninterruptable power source in case of machine mains power loss. Built-in sensors and local electronics provide machine and mask safety by stopping robot 40 in case of end-stroke violations, too high vertical forces or too high velocities. Safety electronics check all sensors for violations of constraints per sensor and in specific combinations, and immediately stop actuator motion, if required.

Figure 6A:
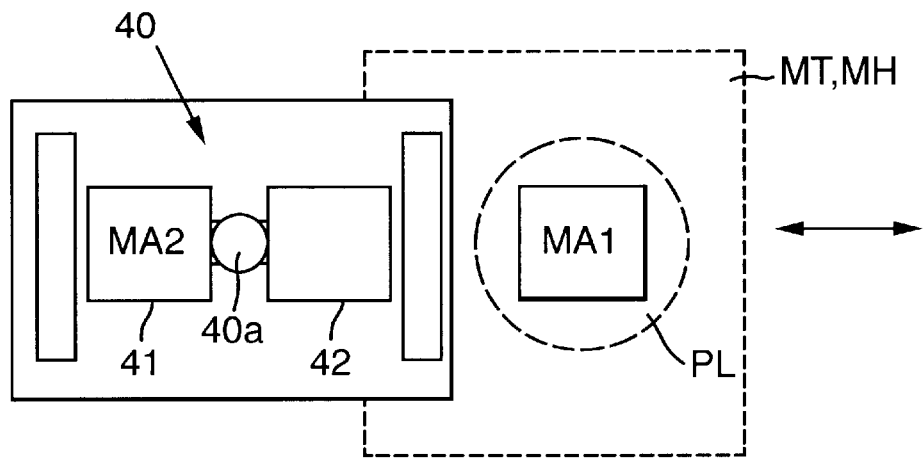
FIG. 6a, 6b and 6c schematically depict an exchange sequence at the mask table using the second robot of the mask-handling apparatus of FIG. 2.
Figure 6B:
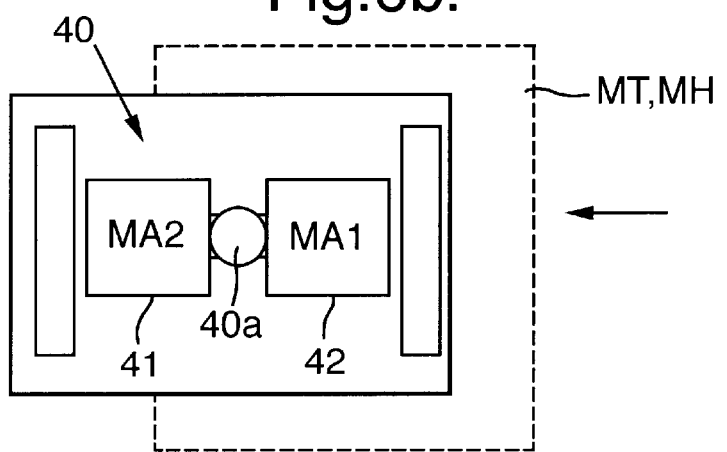
Figure 6C:
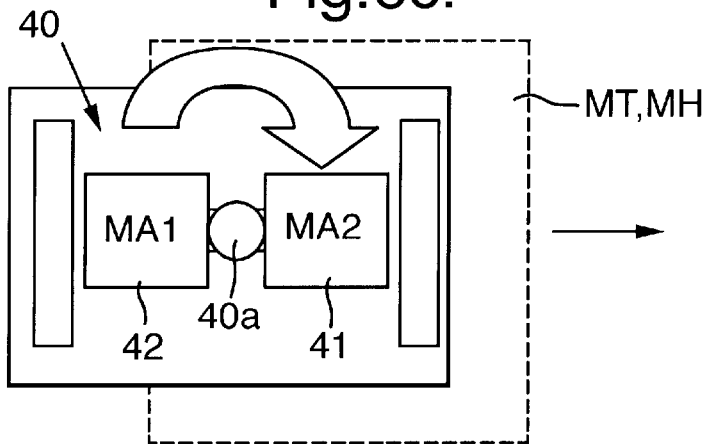

Referring to FIGS. 6*a*, 6*b* and 6*c*, the sequence for exchanging a mask MA1 present on mask table MT for another mask MA2 is described. In a first step, mask MA2 is transferred by mask-handling robot 30 to mask-holding arrangement 41 of mask-exchange robot 40 while mask MA1 is still being used for an imaging process and is present above projection system PL. The situation after transfer of mask MA2 to robot 40 while mask MA1 is still above projection system PL is shown in FIG. 6*a*. Upon completion of the imaging or exposure process, mask table MT comes to an unload position, shown in FIG. 6*b*, and mask MA1 is taken off mask holder MH using the vacuum-operated end-effector and the elevator of mask-holding arrangement 42 of robot 40. A vacuum holding mask MA1 on the mask table should first be released and then a vacuum of the end-effector should be operated. Subsequently, second robot 40 is rotated over 180°, shown in FIG. 6*c*, and mask MA2 is lowered by the elevator of mask-holding arrangement 41 onto mask table MT. Vacuum of the vacuum-operated end-effector of mask-holding arrangement 41 is released and a vacuum of the mask table is operated to hold mask MA2 on mask table MT. Mask table MT will then return to its position above projection system PL for a next imaging or exposure cycle. Mask MA1 will in a next step be exchanged by robot 30 from robot 40 to any one of the load-port module 20, mask inspection module 60, and internal mask library 50. The actual exchange of a mask at the mask table is carried out by dedicated mask-exchange robot 30, and will take place very fast and efficiently.

Figure 7:
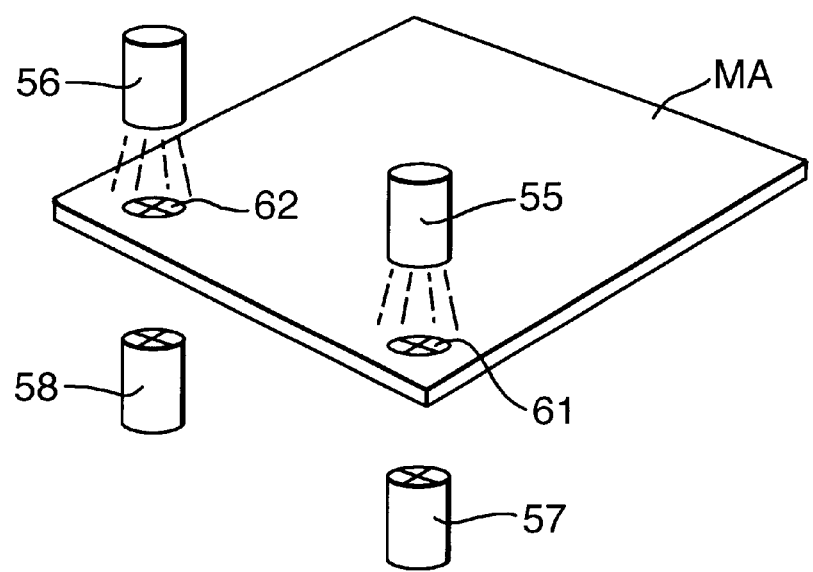
FIG. 7 depicts a mask held in a pre-alignment unit of the mask-handling apparatus of FIG. 2.

In exchanging a mask between first robot 30 and second robot 40 and between second robot 40 and mask table MT, first and second robots and second robot and mask table have to be aligned, respectively. To this end, mask-handling apparatus 10 is provided with two pre-alignment units 51, 52 that have an identical working principle. Each pre-alignment unit comprises two illumination units 55, 56, for instance LEDs, producing a very homogeneous and relatively large light spot, and two quad-cell detectors 57, 58, each quad-cell detector being arranged below a respective illumination unit and being arranged at a predetermined distance from the other quad-cell detector. The distance in between both quad-cell detectors corresponds to a distance between two markers 61, 62 present on mask MA, both markers taking the form of a cross that is arranged in a transparent part of the mask. FIG. 7 depicts the configuration of illumination units 55, 56 and quad-cell detectors 57, 58 in a pre-alignment unit, and shows mask MA having markers 61, 62 in between illumination units and quad-cell detectors. In an aligned reference position, a cross of a marker has its shadow projected on the interfaces of the quad-cells of a corresponding quad-cell detector. Each quad-cell output signal is normalized to incident illumination intensity. Pre-alignments units 51, 52 are fixedly arranged with respect to mask handler 10.

When transferring a mask from first robot 30 to second robot 40, a mask present on end-effector 32 of robot 30 is positioned within pre-alignment unit 51. By reading the output of the quad-cell detectors, the actual position of a marker 61, 62 with respect to its respective quad-cell detector 57, 58 and thus of the mask with respect to alignment unit 51 is known. First robot 30 will then adjust the position of its end-effector 32 and a mask held by it such that the mask is positioned in the reference position above the quad-cell detectors. Such a reference position is in an initial set-up of the mask-handling apparatus arranged in alignment with the mask-holding arrangements of second robot 40 when positioned for exchanging a mask with first robot 30. The mask may subsequently be transferred to second robot 40.

When transferring a mask from second robot 40 to mask table MT, the position of a mask present on the second robot for transfer to the mask table is measured by alignment unit 52 that is configured identical to alignment unit 51 above. The position of the mask table is adjusted to the detected position of the mask, and the mask will be transferred to the mask table as described. Special compliance mechanisms (not shown) that link the end-effectors to the elevators and a guiding mechanism on the mask table accommodate for any misalignment that may remain between mask table MT and second robot 40. For transferring a mask from the mask table to the second robot, the mask table holding a mask is aligned to the reference position in alignment unit 52 by reading the outputs of the quad-cell detectors and subsequently it is transferred to second robot 40. Second robot 40 only allows rotation. First robot 30 and mask table MT compensate for any misalignment by moving accordingly.

The mask-handling apparatus 10 allows an easy reconfiguration to either a left-handed or right-handed machine by interchanging appropriate building blocks that can be distinguished in FIG. 2. Further, the various building blocks may be designed such that both 6" and 9" masks (reticles) can be employed on a single machine and that the apparatus can be operated in a class one cleanroom. The main features of the mask-handling apparatus is a very fast mask exchange time and an improved productivity by parallel processing of inspection of masks for contamination, inventory of the mask carrier, mask pre-alignment and mask exchange.

Whilst a specific embodiment of the invention is disclosed above, it will be appreciated that the invention may be practiced other than described. The description is not intended to limit the invention.

What is claimed is:

1. A lithographic projection apparatus for imaging of a mask pattern in a mask onto a substrate, said apparatus comprising:
    an illumination system constructed and arranged to supply a projection beam of radiation;
    a mask table provided with a mask holder constructed to hold a mask;
    a substrate table provided with a substrate holder constructed to hold a substrate;
    a projection system constructed and arranged to image an irradiated portion of the mask onto a target portion of the substrate; and
    a mask-handling apparatus comprising:
        a load-port module constructed to receive masks, the mask-handling apparatus being constructed and arranged to exchange a mask between the load-port module and the mask holder;
        a first robot; and
        a second robot,
        the first robot being constructed and arranged to exchange a mask between the load-port module and the second robot, the second robot being provided with two mask-holding arrangements, wherein each mask-holding arrangement comprises an independently movable elevator constructed and arranged to exchange a mask between the first robot and the mask holder.

2. A lithographic projection apparatus according to claim 1, wherein the second robot is rotatable.

3. A lithographic projection apparatus according to claim 1, wherein the elevators are provided with vacuum-operated end-effectors constructed to hold a mask at its top side.

4. A lithographic projection apparatus according to claim 1, wherein the mask-handling apparatus further comprises at least one further mask station constructed to receive a mask, and the first robot is constructed and arranged to exchange a mask between one of the load-port module, the second robot and the at least one further mask station and another one of the load-port module, the second robot and the at least one further mask station.

5. A lithographic projection apparatus according to claim 4, wherein the at least one further mask station comprises a mask library constructed and arranged to store one or more masks.

6. A lithographic projection apparatus according to claim 4, wherein the at least one further mask station comprises a mask inspection station constructed and arranged to check a mask for contamination.

7. A lithographic projection apparatus according to claim 1, wherein the first robot has an arm-like configuration provided with three rotary joints such as to allow movement in a plane.

8. A lithographic projection apparatus according to claim 7, wherein the first robot further comprises a linear actuator such as to allow for a translation in a direction perpendicular to said plane.

9. A lithographic projection apparatus according to claim 1, wherein the mask-handling apparatus further comprises at least one pre-alignment unit constructed and arranged to detect a position of a mask held by one of the first robot, the second robot and the mask holder, the at least one pre-alignment unit being associated with a position of the second robot allowing for exchange of a mask with one of the first robot and the mask holder.

10. A lithographic projection apparatus according to claim 9, wherein the at least one pre-alignment unit comprises at least one detector constructed to detect a position of a marker present on a mask.

11. A lithographic projection apparatus according to claim 10, wherein the at least one detector is a quad-cell detector.

12. A lithographic projection apparatus according to claim 10, wherein the pre-alignment unit further comprises at least one illumination unit arranged to illuminate a marker on the mask.

13. A method of manufacturing a device using a lithographic projection apparatus comprising:
    providing a mask bearing a pattern to a mask holder by:
        (a) providing the mask to a load-port module;
        (b) using a first robot to exchange the mask between the load-port module and a second robot; and
        (c) using the second robot, provided with two mask-holding arrangements, wherein each mask-holding arrangement comprises an independently movable elevator constructed and arranged, to exchange the mask between the first robot and the mask holder; and
    using a projection beam of radiation to project an image of at least a portion of the mask pattern onto a target portion on a substrate which is at least partially covered by a layer of radiation sensitive material.

14. A device manufactured by a method comprising:
    providing a mask bearing a pattern to a mask holder by:
        (a) providing the mask to a load-port module;
        (b) using a first robot to exchange the mask between the load-port module and a second robot; and
        (c) using the second robot, provided with two mask-holding arrangements, wherein each mask-holding arrangement comprises an independently movable elevator constructed and arranged, to exchange the mask between the first robot and the mask holder; and
    using a projection beam of radiation to project an image of at least a portion of the mask pattern onto a target portion on a substrate which is at least partially covered by a layer of radiation sensitive material.

* * * * *